(12) United States Patent
Benedict et al.

(10) Patent No.: US 11,569,574 B2
(45) Date of Patent: Jan. 31, 2023

(54) MILLIMETER WAVE PHASED ARRAY

(71) Applicant: RAYTHEON COMPANY, Waltham, MA (US)

(72) Inventors: James E. Benedict, Lowell, MA (US); John P. Haven, Lowell, MA (US); Peter J. Adams, Hudson, NH (US); Thomas V. Sikina, Acton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 737 days.

(21) Appl. No.: 16/418,231

(22) Filed: May 21, 2019

(65) Prior Publication Data

US 2020/0028257 A1 Jan. 23, 2020

Related U.S. Application Data

(60) Provisional application No. 62/674,868, filed on May 22, 2018.

(51) Int. Cl.
| | |
|---|---|
| *H01Q 1/36* | (2006.01) |
| *H01Q 9/27* | (2006.01) |
| *B33Y 80/00* | (2015.01) |
| *H01Q 3/26* | (2006.01) |
| *B33Y 10/00* | (2015.01) |
| *H01L 23/60* | (2006.01) |

(52) U.S. Cl.
CPC ............... *H01Q 3/26* (2013.01); *B33Y 80/00* (2014.12); *H01Q 1/36* (2013.01); *H01Q 9/27* (2013.01); *B33Y 10/00* (2014.12); *H01L 23/60* (2013.01)

(58) Field of Classification Search
CPC .......... B33Y 10/00; B33Y 80/00; H01Q 1/36; H01Q 21/06; H01Q 21/061; H01Q 3/26; H01Q 9/27
See application file for complete search history.

(56) References Cited

U.S. PATENT DOCUMENTS

| | | | |
|---|---|---|---|
| 6,781,560 B2 * | 8/2004 | Goldstein | H01Q 21/22 343/853 |
| 7,348,932 B1 * | 3/2008 | Puzella | H01Q 21/0025 342/373 |
| 7,489,283 B2 * | 2/2009 | Ingram | H01Q 3/26 342/371 |
| 7,548,205 B2 * | 6/2009 | Mohamadi | H01Q 21/0093 343/792 |
| 8,749,446 B2 | 6/2014 | Manry, Jr. et al. | |

(Continued)

OTHER PUBLICATIONS

International Search Report and Written Opinion in application No. PCT/US2019/033289 dated Aug. 26, 2019.

(Continued)

*Primary Examiner* — Tho G Phan
(74) *Attorney, Agent, or Firm* — Lando & Anastasi, LLP

(57) ABSTRACT

A wave phased array is manufactured using additive manufacturing technology (AMT). The wave phased array includes a radiator, a radiator dilation layer supporting the radiator, a beamformer supporting the radiator dilation layer, a beamformer dilation layer supporting the beamformer, and a substrate support layer supporting the beamformer dilation layer. At least one of the radiator, the radiator dilation layer, the beamformer, the beamformer dilation layer and the substrate support layer is fabricated at least in part by an AMT process.

17 Claims, 14 Drawing Sheets

(56) References Cited

U.S. PATENT DOCUMENTS

| | | | |
|---|---|---|---|
| 10,096,537 B1* | 10/2018 | Chen | F28D 15/0266 |
| 2003/0184476 A1* | 10/2003 | Sikina | H01Q 21/0031 |
| | | | 343/700 MS |
| 2009/0273517 A1 | 11/2009 | Thiesen et al. | |
| 2010/0066631 A1 | 3/2010 | Puzella et al. | |
| 2012/0249385 A1 | 10/2012 | Wang | |
| 2016/0172741 A1* | 6/2016 | Panat et al. | |
| 2017/0092565 A1* | 3/2017 | Chen | H01L 21/4882 |
| 2019/0148807 A1* | 5/2019 | Sikina | H01P 3/082 |
| | | | 333/238 |
| 2020/0028257 A1* | 1/2020 | Benedict | H01L 23/66 |

OTHER PUBLICATIONS

Ferendeci, Altan "Monolithically Processed Vertically Interconnected 3D Phased Array Antenna Module", IEEE (2000), pp. 151-157.
Tehrani et al. "Inkjet-Printed 3D Interconnects for Millimeter-Wave System-on-Package Solutions", IEEE (2016).
Yu X. et al., 3D printable multilayer phased array design. 2015 USNC-URSI Radio Science Meeting (Joint with AP-S Symposium), Jul. 24, 2015, p. 351.

* cited by examiner

| Function | Material | Height (Mils) | Sub Total (Mils) |
|---|---|---|---|
| Conductive Spiral Radiator | Copper | 0.7 | |
| Radiator Feed Substrate | Rogers RT/Duroid 5880 | 73 | |
| Conductive Feed Ground | Copper | 0.7 | |
| Radiator Bond Film | Rogers 3001 Bond Film | 1 | |
| Radiator Substrate Upper | Rogers RO3003 | 10 | |
| Radiator Bond Film | Rogers 3001 Bond Film | 1 | |
| Radiator Substrate Lower | Rogers RO3003 | 10 | |
| Radiator Ground | Copper | 0.7 | 97.1 |
| Dilation Bond Film | Rogers 3001 Bond Film | 1 | |
| Dilation Substrate Upper | Rogers RT/Duroid 6006 | 10 | |
| Dilation Bond Film | Rogers 3001 Bond Film | 1 | |
| Dilation Substrate Lower | Rogers RT/Duroid 6006 | 10 | |
| Dilation Ground | Copper | 0.7 | 22.7 |
| BeamFormer Bond Film | Rogers 3001 Bond Film | 1 | |
| BeamFormer Substrate | Taconic CER10 | 50 | |
| BeamFormer Ground | Copper | 0.7 | 51.7 |
| DC & Logic Bond Film | Rogers 3001 Bond Film | 1 | |
| DC & Logic Substrate | FR-4 | 4 | |
| DC & Logic Traces | Copper | 0.7 | 5.7 |
| | | Total | 177.2 |

FIG. 9

MILLIMETER WAVE PHASED ARRAY

CROSS-REFERENCE TO RELATED APPLICATIONS

This application claims the benefit under 35 U.S.C. § 119(e) of U.S. Provisional Patent Application No. 62/674,868 titled MILLIMETER WAVE PHASED ARRAY filed on May 22, 2018, which is herein incorporated by reference in its entirety for all purposes.

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as transmission line (e.g., stripline) dimensions, and dimensions of dielectric materials between conductors (e.g., dielectric thickness, inter-via spacing, etc.), thereby limiting the range of highest frequency signals that may be supported by such circuits.

Radiator designs currently employ a standard PCB process, which, as mentioned, relies on multiple process steps, expensive materials, and slow cycle turnaround time. In addition, miniaturized dimensions are difficult and unreliable to produce phased arrays for 5G frequencies of approximately 30+ GHz. Connectivity issues are further present with prior attempts at component design.

SUMMARY

One aspect of the present disclosure is directed to a wave phased array manufactured using additive manufacturing technology (AMT). In one embodiment, the wave phased array comprises a radiator, a radiator dilation layer supporting the radiator, a beamformer supporting the radiator dilation layer, a beamformer dilation layer supporting the beamformer, and a substrate support layer supporting the beamformer dilation layer. At least one of the radiator, the radiator dilation layer, the beamformer, the beamformer dilation layer and the substrate support layer is fabricated at least in part by an AMT process.

Embodiments of the wave phased array further may include the radiator embodying a spiral antenna. The radiator further may include a vertical launch surrounding feed lines for the spiral antenna. The radiator further may include Faraday walls disposed around the feed lines and the vertical launch. The wave phased array may be configured to produce an electromagnetic signal having a frequency in the range of 24 GHz to 75 GHz. The wave phased array may be configured to produce an electromagnetic signal having a frequency of approximately 30 GHz. The radiator may have a thickness of approximately 97 mils. The radiator dilation layer may have a thickness of approximately 23 mils. The beamformer may have a thickness of approximately 52 mils. The substrate support layer may embody chips and DC logic and may have a thickness of approximately 6 mils. The wave phase array may have a total thickness of approximately 177 mils.

Another aspect of the present disclosure is directed to an AMT process for fabricating a wave phased array including a radiator, a radiator dilation layer supporting the radiator, a beamformer supporting the radiator dilation layer, a beamformer dilation layer supporting the beamformer, and a substrate support layer supporting the beamformer dilation layer. Embodiments of the process further may include at least one of the following: milling; conductive ink deposition; and lamination under CAD control.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures:

FIG. 9 is a layer-by-layer description of the wave phased array structure profile shown in FIG. 8;

DETAILED DESCRIPTION

Figure 1:
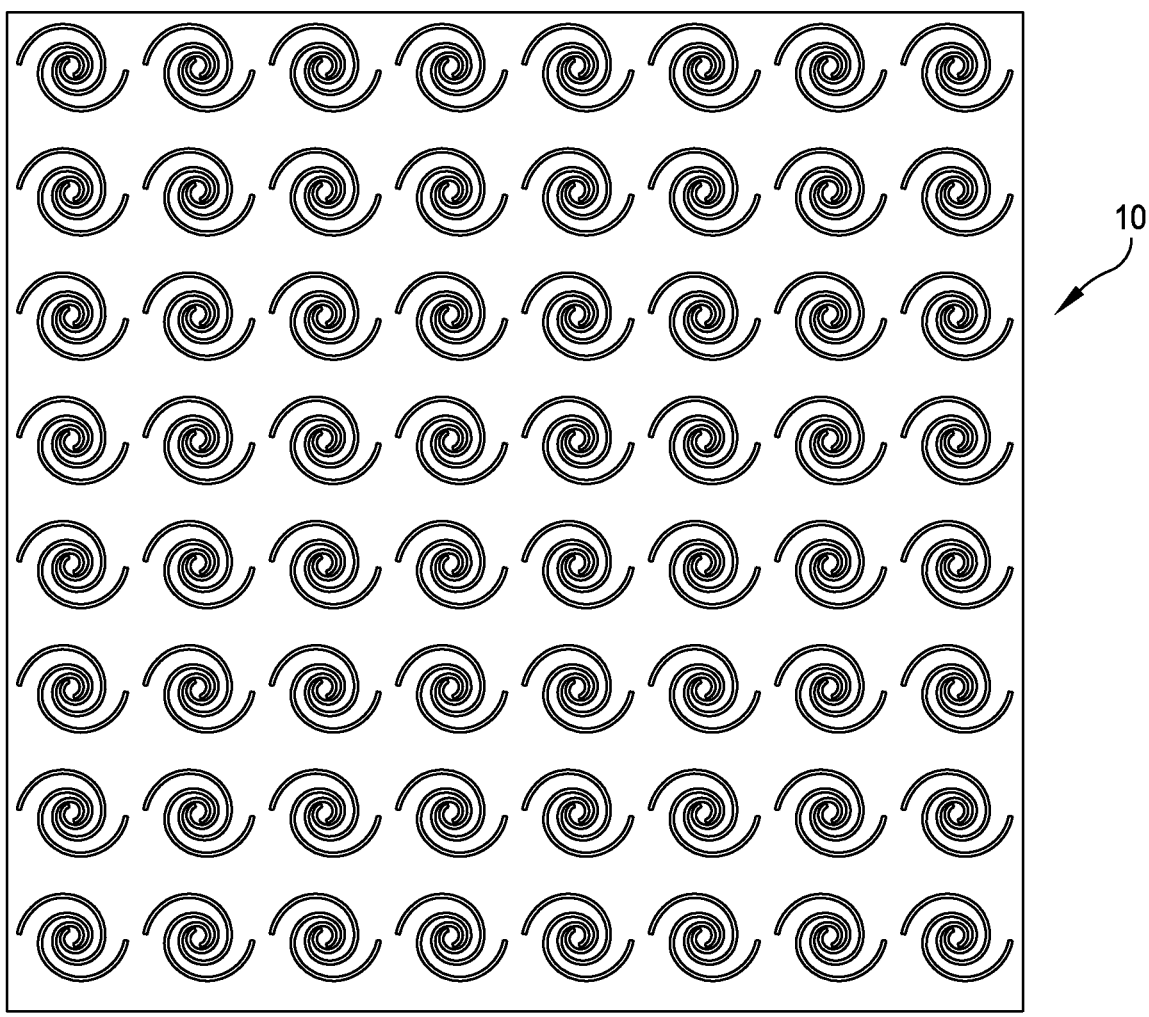
FIG. 1 is a plan view of a wave phased array structure fabricated using an additive manufacturing technology (AMT) process of an embodiment of the present disclosure.

Aspects and examples described herein provide wave phased array structures within various circuits for the containment and conveyance of millimeter wave signals. The wave phased array structures described herein efficiently distribute signal currents while maintaining characteristic impedance and minimizing signal loss. The wave phased array structures described herein are suitable for various circuit board manufacturing, including radio frequency circuit embodiments, and advantageously apply subtractive and additive manufacturing techniques. Such techniques may provide structures capable of conveyance and containment of radio frequency signals in microwave and millimeter wave ranges, for example from 28 GHz to 70 GHz, and up to 300 GHz or more.

The concepts, systems and techniques described herein are directed toward a phased array antenna provided using additive manufacturing technology so as to provide the phased array antenna configured to produce millimeter wave signals.

Manufacturing processes described herein may be particularly suitable for fabrication of circuit structures having physically small features capable of supporting electromagnetic signals in the range of 8 to 75 GHz or more, for example, and up to 300 GHz or more, using suitable subtractive (e.g., machining, milling, drilling, cutting, stamping) and more importantly additive (e.g., filling, flowing, 3-D printing) manufacturing equipment. Electromagnetic circuit structures in accord with systems and methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals, for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accord with those described herein may be suitable for handling non-ionizing radiation, at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

The methods and apparatuses described herein may support smaller arrangements and dimensions than conventional processes are capable. Conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, at lower cost.

Electromagnetic circuits and methods of manufacture in accord with those described herein include various additive and subtractive manufacturing techniques to produce electromagnetic circuits and components capable of handling higher frequencies, with lower profiles, and at reduced costs, cycle times, and design risks, than conventional circuits and methods. Examples of techniques include machining (e.g., milling) of conductive material from a surface of a substrate to form transmission wave phased arrays, which may be of significantly smaller dimensions than allowed by conventional PCB processes, machining of one or more substrates to form a trench, using 3-dimensional printing techniques to deposit printed conductive inks into the trench to form a continuous electric barrier (e.g., a Faraday wall) (as opposed to a series of ground vias with minimum spacing therebetween), "vertical launch" signal paths formed by machining (such as milling, drilling, or punching) a hole through a portion of substrate and in which a conductor (such as a wire segment) is placed and/or conductive ink is printed, to make electrical contact to a transmission line disposed on a surface of the substrate (or an opposing substrate), and using 3-dimensional printing techniques to deposit printed resistive inks to form resistive components.

Any of the above example techniques and/or others (e.g., soldering and/or solder reflow), may be combined to make various electromagnetic components and/or circuits. Aspects and examples of such techniques are described and illustrated herein with respect to a wave phased array to contain and convey an electromagnetic signal along a layer of an electromagnetic circuit in one dimension and, optionally, vertically through to other layers of the circuit in another dimension. The techniques described herein may be used to form various electromagnetic components, connectors, circuits, assemblies, and systems.

Figure 2:
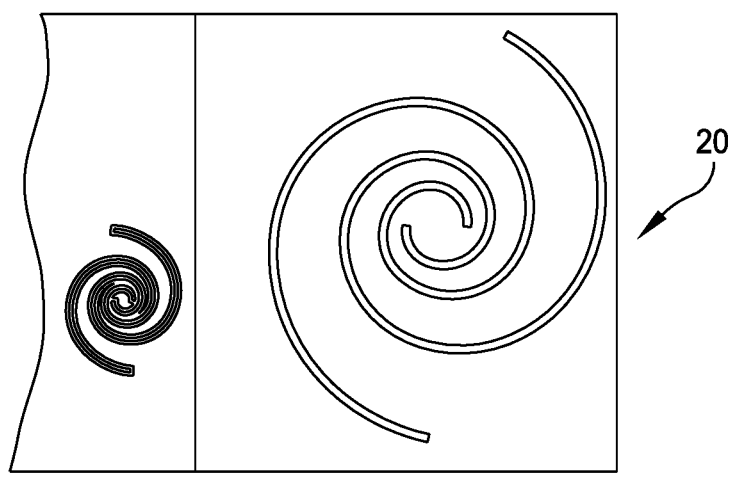
FIG. 2 is a plan view of subassemblies of the wave phased array structure.
Figure 3:
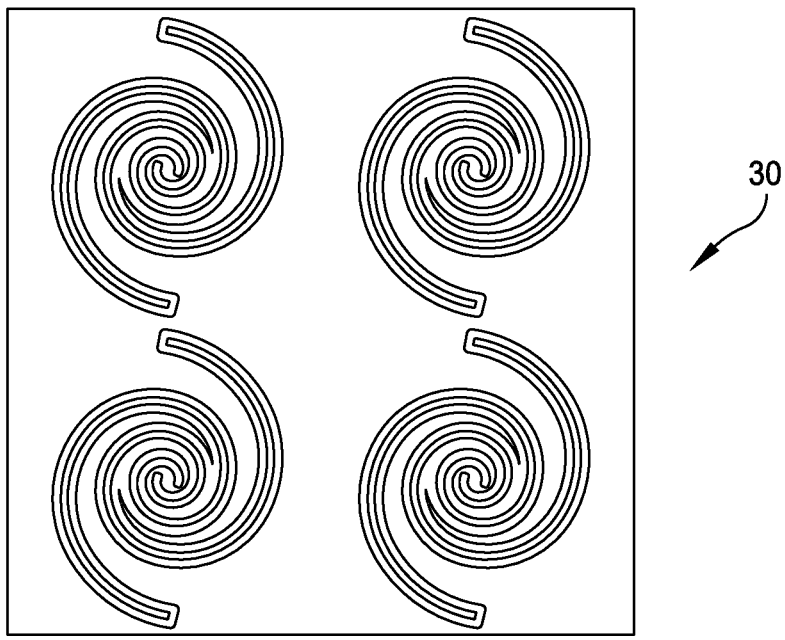
FIG. 3 is a plan view of a component of the wave phased array structure.

Referring to the drawings, and more particularly to FIG. 1, a wave phased array structure fabricated from additive manufacturing technology (AMT) is generally indicated at 10. As will be described in greater detail below, AMT is leveraged to reduce cost and manufacturing time. The wave phased array structure can be fabricated to include Faraday walls, vertical-launch connections, printed connectivity, single step milling and filling, milled copper transmission lines and printing of conductive shapes. For example, with additional reference to FIGS. 2 and 3, which illustrate exemplary wave phased array structures, generally indicated at 20 and 30, respectively, each having several components, the wave phased array structure that are fabricated from one-step prototyping to achieve a desired level of miniaturization at a low cost. AMT fabrication techniques allow for miniaturized feature sizes and low profile for frequencies of 30+ GHz, reduce wave phased array feature sizes, and reduce fabrication cost for commercially viable wave phased arrays. AMT techniques further enable miniaturization of array profile (thickness) to fit within platform constraints and for spiral element geometry which provides sufficient radar bandwidth for particular applications.

As used herein, AMT refers to manufacturing processes, equipment and materials that are used to produce objects. For example, AMT can include 3D printing processes that are used to produce three-dimensional objects. Other processes can be implemented, such as jetting, fusion, extrusion, deposition and lamination processes. Factors determining which process to pursue include, but are not limited to speed of production, costs, use of material and geometric limitations.

Figure 4:
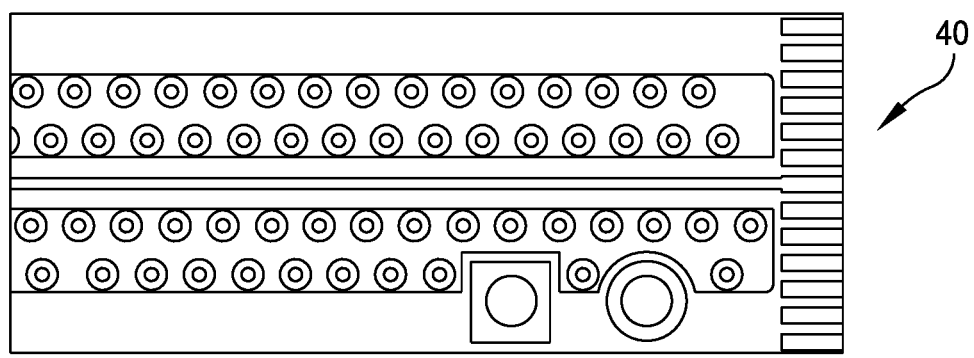
FIG. 4 is a plan view of a typical printed circuit board (PCB) ground via configuration.
Figure 5:
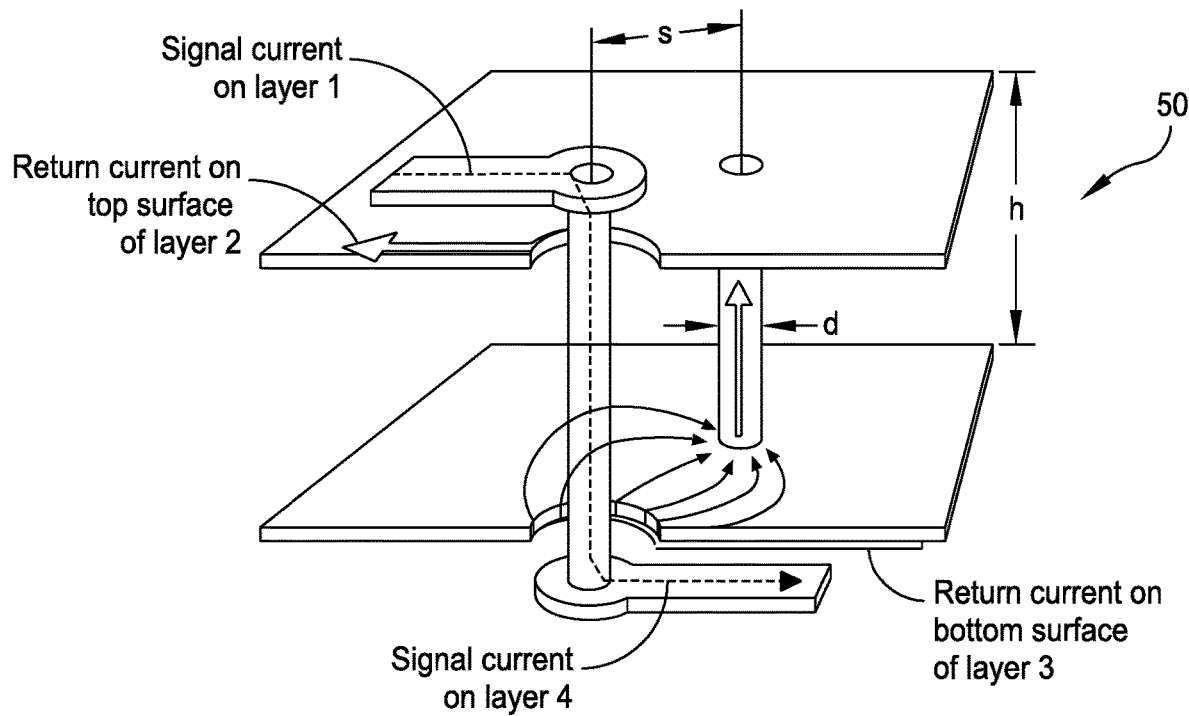
FIG. 5 is a perspective view of another typical PCB ground via configuration.

Referring to FIGS. 4 and 5, which illustrates typical PCB ground via structures, generally indicated at 40 and 50, respectively, 30 GHz phased arrays generally are not commercially available since such arrays are not practical due to current electroetch process limitations. Such commercially available wave phased arrays are fabricated using standard PCB process, which requires multiple process steps which increases cost and cycle time and restricts feature size and precision. The multi-step process is a significant cost driver for both terrestrial- and space-based phased arrays. Conductive vias are used for mode suppression and tuning, which require higher density ground via fields. Ground via fields and fences are generally not effective, and cause leakage or coupling between radio frequency (RF) circuits. This leads to complex rules to maintain adequate RF isolation and produces long and risky development cycles.

Figure 6:
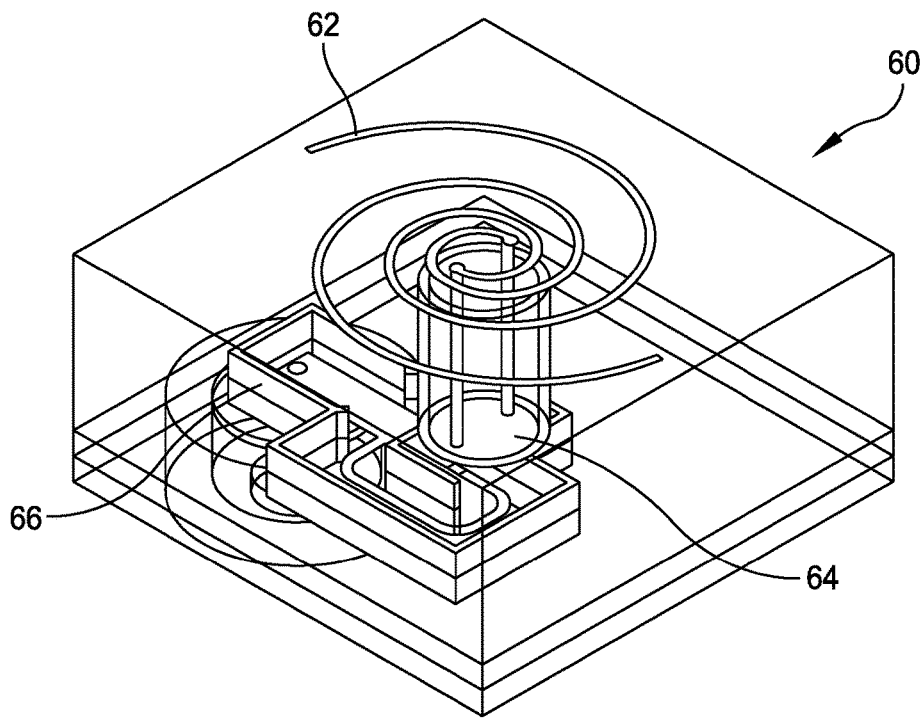
FIG. 6 is a perspective view of a wave phased array structure of an embodiment of the present disclosure.

Referring to FIG. 6, a radiator that is fabricated using AMT techniques is generally indicated at 60. As shown, the radiator 60 includes miniaturized features having two to three mil trace widths and vertical transition vias having a maximum depth of 80 mils. The radiator includes a spiral antenna 62 to provide circular polarization, having 3 GHz radar bandwidth and good scan performance. In the shown example, all radiator boundary conditions use AMT process, having high conductivity copper in high current areas and small geometric features. The radiator 60 includes printed vertical-launch feature 64 and Faraday walls 66.

In one embodiment, the spiral antenna 62 of the radiator 60 includes a spiral antenna portion coupled to a feed circuit portion. The spiral antenna portion includes an antenna substrate having two or more spiral conductors disposed or otherwise formed on a surface of the antenna substrate. Each of the spiral conductors has an inner end which defines an inner radius of the spiral and an outer end which defines an outer radius of the spiral. It should be appreciated that, depending upon the particular type of spiral antenna, the spacing and width may change at different points along the spiral.

The vertical launch feature 64 of the radiator 60 is disposed between a first ground plane of a stripline feed circuit substrate and the surface of the antenna substrate and surrounds (i.e., encompasses) vertical launch feed lines. In preferred embodiments, the vertical launch feature 64 is provided having a solid shape. In embodiments, it may be possible to provide a wall having gaps, slots or other forms of openings provided therein. In embodiments, one end of the vertical launch feature is in electrical contact with a feed circuit ground plane and a second opposite end of the vertical launch feature extends through the antenna substrate, but does not extend to the antenna substrate surface.

In embodiments, the Faraday wall 66 may or may not be in physical contact with a second ground plane. Such a conductive Faraday wall 66 confines electric fields to thus provide isolation and mode suppression. The vertical launch feature 64 and the Faraday wall 66 thus serves as a vertical launch isolation and mode suppression structure and thereby aids in providing the spiral antenna 62 with desired antenna operating characteristics.

In certain embodiments, antenna elements may be grouped together into a subarray and fed together in a phase-controlled manner to generate a beam characteristics of an antenna larger than that of any single antenna element. A beamformer can include a beam port and a plurality of element ports. In a transmit mode, the signal to be transmitted is applied to the beam port and is distributed by the beamformer to the various element ports. In the receive mode, the unguided electromagnetic signals received by the antenna elements and coupled in guided form to the element ports are combined to produce a beam signal at the beam port of the beamformer.

Figure 7:
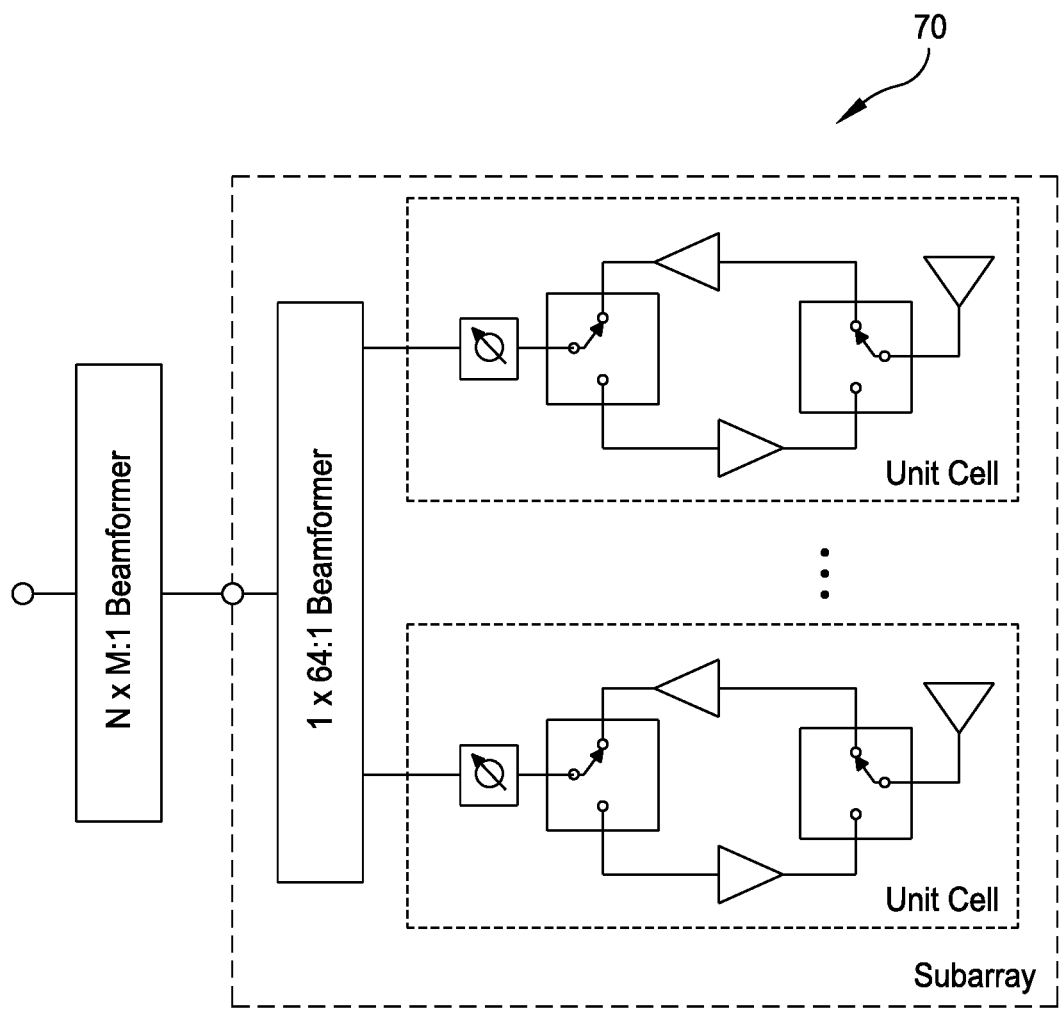
FIG. 7 is a schematic view of a wave phased array block diagram concept of an embodiment of the present disclosure.

Referring to FIG. 7, a wave phased array block diagram concept is generally indicated at 70. As shown, the array block diagram concept 70 sets out a logical organization of the array components. A hierarchical structure of the array block diagram concept includes a panel, which functions as an array building block, a subarray, which functions as a panel building block, and a unit cell, which functions as the smallest functional unit. In one conceptual model, the wave phased array block diagram concept 70 is configured to include: single circular polarization, switched Tx/Rx path, half-duplex array operation, unit cell phase and amplitude control, and 8×8 subarray building block.

Figure 8:
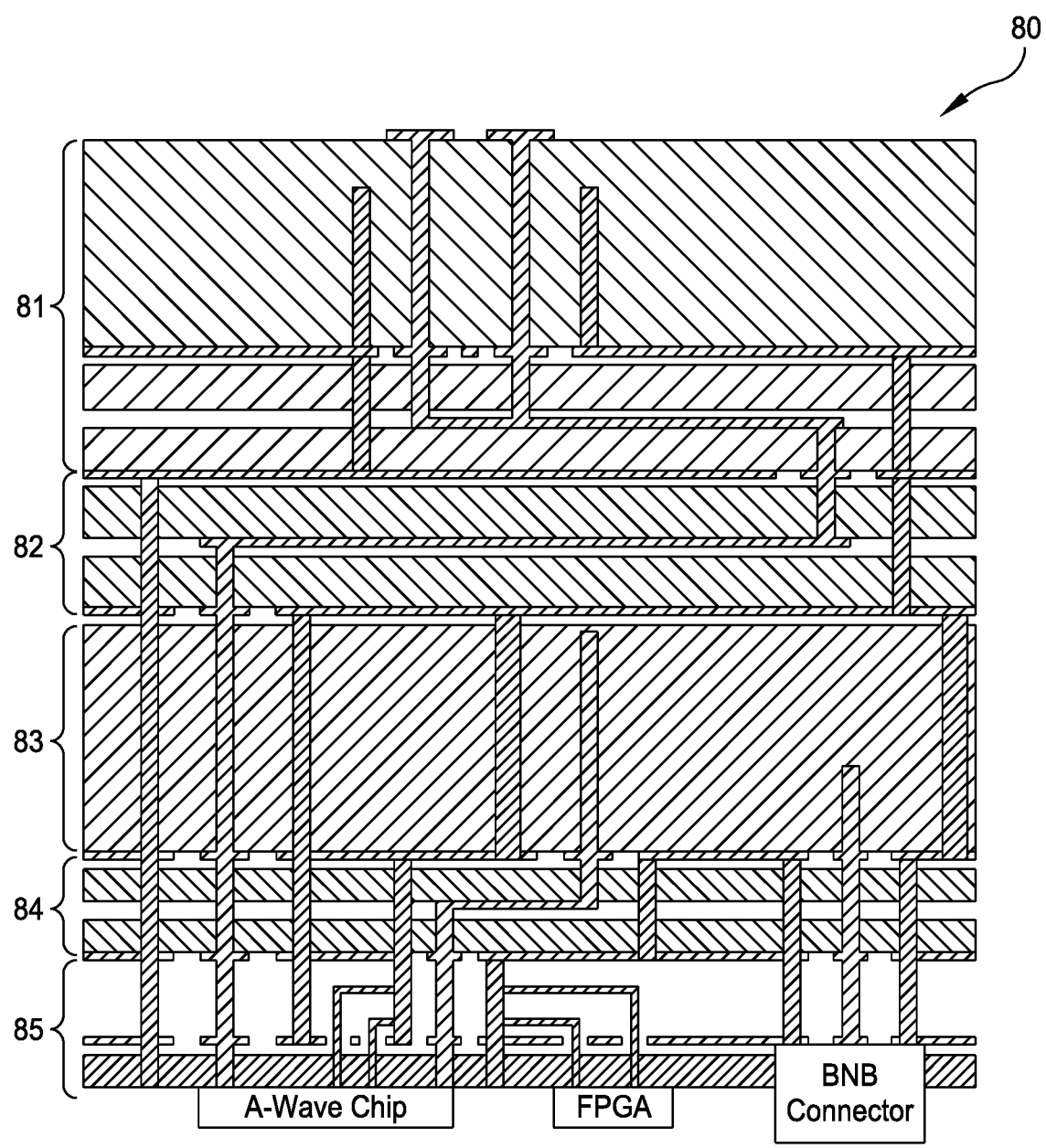
FIG. 8 is a schematic cross-sectional view of a wave phased array structure profile of an embodiment of the present disclosure.

Referring to FIG. 8, an exemplary wave phased array structure profile is generally indicated at 80. As shown, the structure 80 includes a radiator 81, a radiator dilation layer 82, a beamformer 83, a beamformer dilation layer 84 and a chip and DC logic layer 85. The constituent parts of the structure 80 are shown in FIG. 9. In one embodiment, the radiator 81 has a thickness of 97.1 mils, the radiator dilation 82 has a thickness of 22.7 mils, the beamformer 83 has a thickness of 51.7 mils and the chip and DC logic layer 85, sometimes referred to as the substrate support layer, has a thickness of 5.7 mils.

In the shown embodiment, the radiator 81 includes (a) a conductive spiral antenna (radiator) fabricated from copper that is 0.7 mils thick, (b) a radiator feed substrate purchased from Rogers under model RT/Duroid 5880 (PTFE/Glass) that is 73 mils thick, (c) a radiator feed ground fabricated from copper that is 0.7 mils thick, (d) a radiator bond film purchased from Rogers under model 3001 Bonding Film that is 1 mil thick, (e) a radiator substrate upper layer purchased from Rogers under model R03003 (ceramic/PTFE) that is 10 mils thick, (f) a radiator bond film purchased from Rogers under model 3001 Bonding Film that is 1 mil thick, (g) a radiator substrate lower layer purchased from Rogers under model R03003 (ceramic/PTFE), and (h) a radiator ground fabricated from copper that is 0.7 mils thick. The overall thickness of the radiator is 97.1 mils thick.

In the shown embodiment, the radiator dilation layer 82 includes (a) a dilation bond film purchased from Rogers under model 3001 Bonding Film that is 1 mil thick, (b) a dilation substrate upper layer purchased from Rogers under model RT/Duroid 6006 (ceramic/PTFE) that is 10 mils thick, (c) a dilation bond film purchased from Rogers under model 3001 Bonding Film that is 1 mil thick, (d) a dilation substrate lower layer purchased from Rogers under model RT/Duroid 6006 (ceramic/PTFE) that is 10 mils thick, and (e) a dilation ground fabricated from copper that is 0.7 mils thick. The overall thickness of the dilation later is 22.7 mils thick.

In the shown embodiment, the beamformer 83 includes (a) a beamformer bonding film purchased from Rogers under model 3001 Bonding Film that is 1 mil thick, (b) a beamformer substrate purchased from Taconic under model CER10 (ceramic/PTFE), and (c) a beamformer ground fabricated from copper that is 0.7 mils thick. The overall thickness of the beamformer 83, including the beamformer dilation layer 84, is 51.7 mils thick.

In the shown embodiment, the chip and DC logic layer 85 includes DC and logic bond film purchased from Rogers under model 3001 Bonding Film that is 1 mil thick, (b) DC and logic substrate fabricated from glass-reinforced epoxy laminate material (FR-4) that is 4 mils thick, and (c) a DC and logic trace layer fabricated from copper that is 0.7 mils thick. The overall thickness of the DC and logic layer is 5.7 mils thick.

Accordingly, the overall thickness of the wave phased array structure 80 is 177.2 mils thick. In addition, by employing the various techniques and methods disclosed herein, the thickness, complexity and costs of fabricating the wave phased array structure is reduced.

Figure 10:
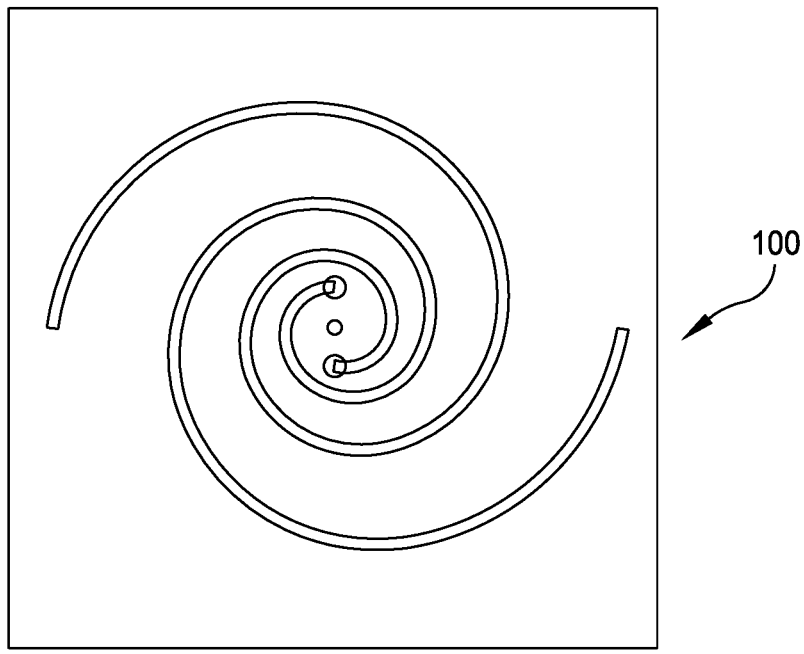
FIG. 10 is a plan view of a wave phased array architecture spiral of an embodiment of the present disclosure.

Referring to FIG. 10, the conductive spiral antenna of the radiator is generally indicated at 100. In one embodiment, the radiator 100 includes a spiral conductor, a central feed transmission line, and a circuit distribution provided in a cavity geometry. Other radiator designs can readily be implemented.

Figure 11:
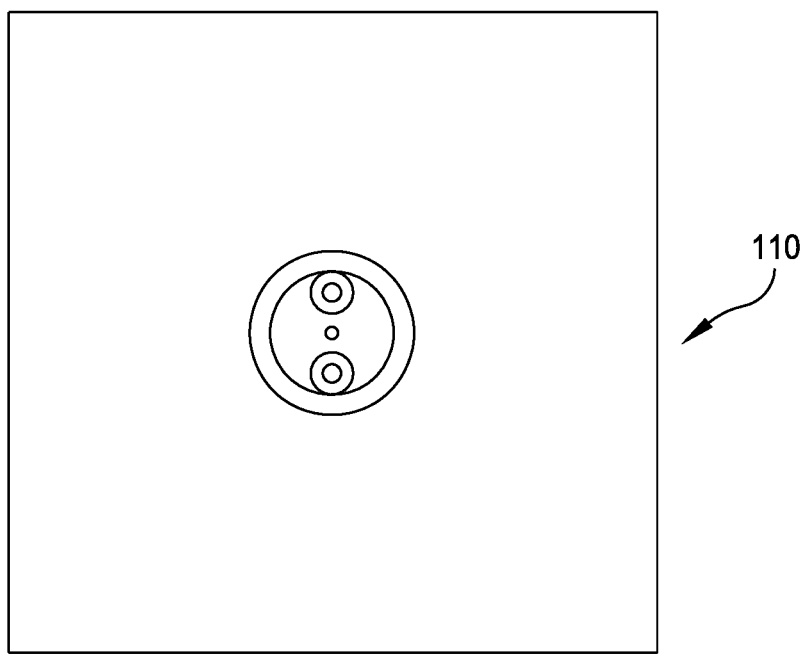
FIG. 11 is a plan view of a wave phased array architecture spiral ground of an embodiment of the present disclosure.

Referring to FIG. 11, the spiral antenna ground is generally indicated at 110. Archimedes or equiangular spiral geometry with open circuit terminations may be employed.

Figure 12:
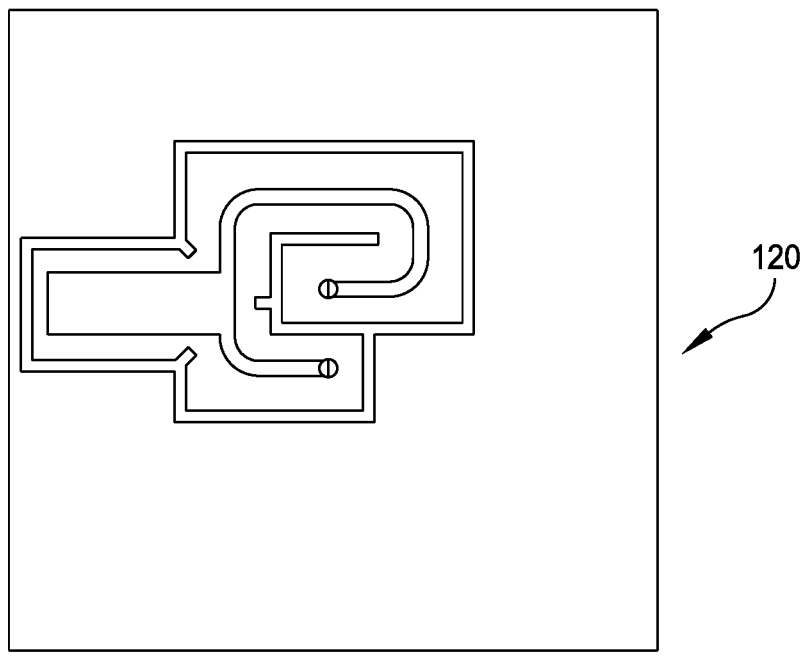
FIG. 12 is a plan view of a wave phased array architecture feed network of an embodiment of the present disclosure.

Referring to FIG. 12, the feed network is generally indicated at 120. The feed circuit introduces impedance matching and transfers the circuit to the active components.

Figure 13:
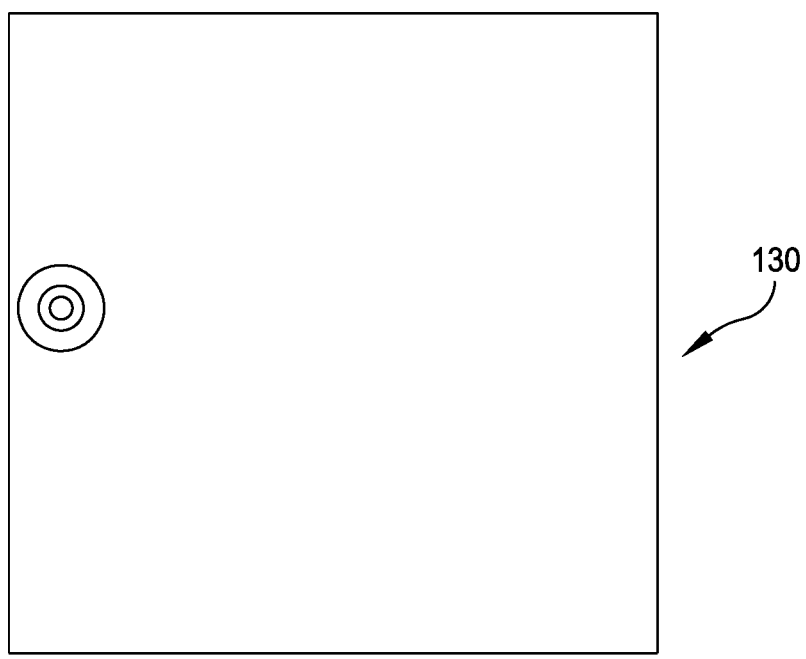
FIG. 13 is a plan view of a wave phased array architecture feed network ground of an embodiment of the present disclosure.

Referring to FIG. 13, the feed network ground is generally indicated at 130.

Figure 14:
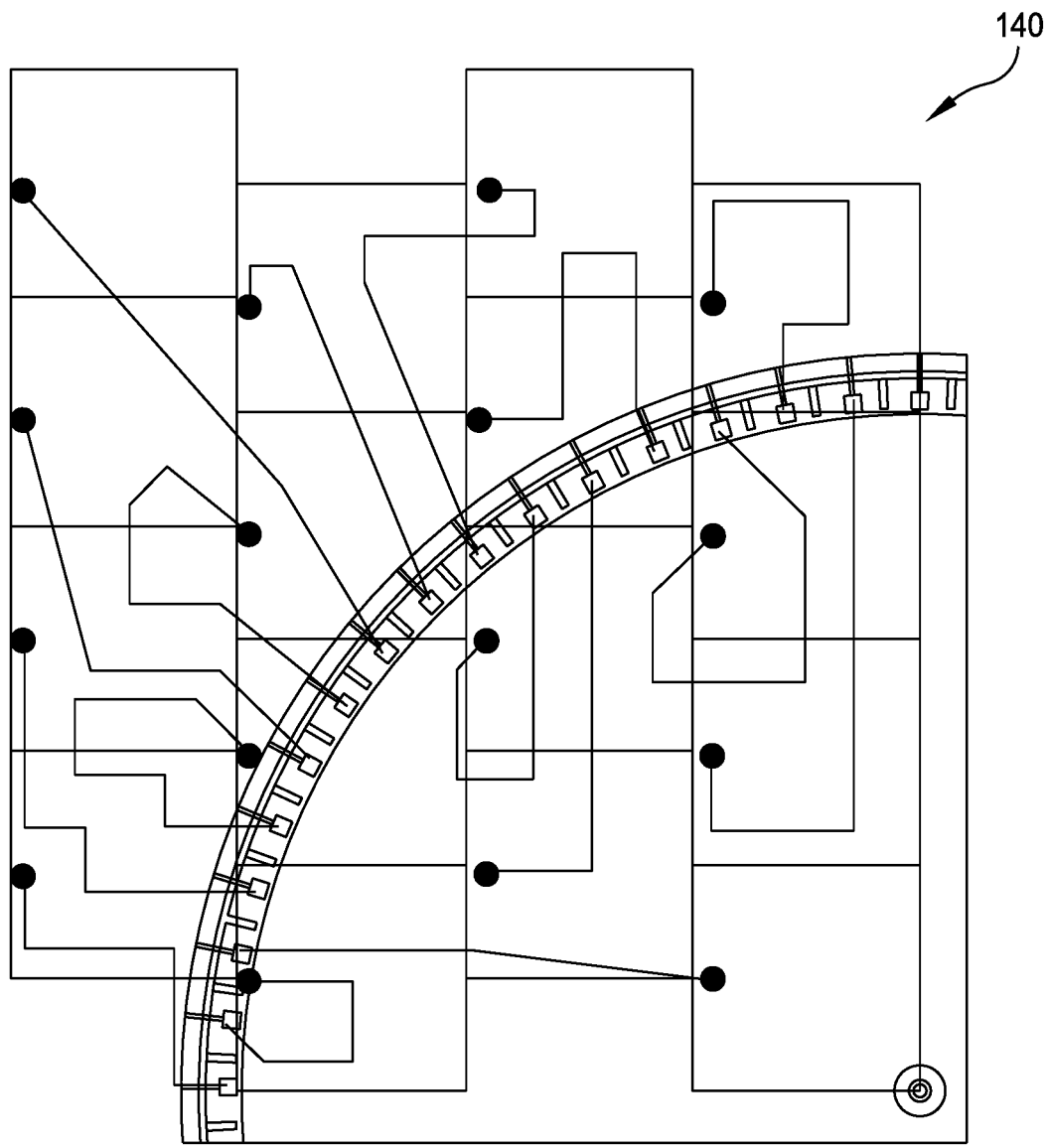
FIG. 14 is a plan view of a wave phased array architecture radiator dilation of an embodiment of the present disclosure.

Referring to FIG. 14, the radiator dilation layer is generally indicated at 140.

Figure 15:
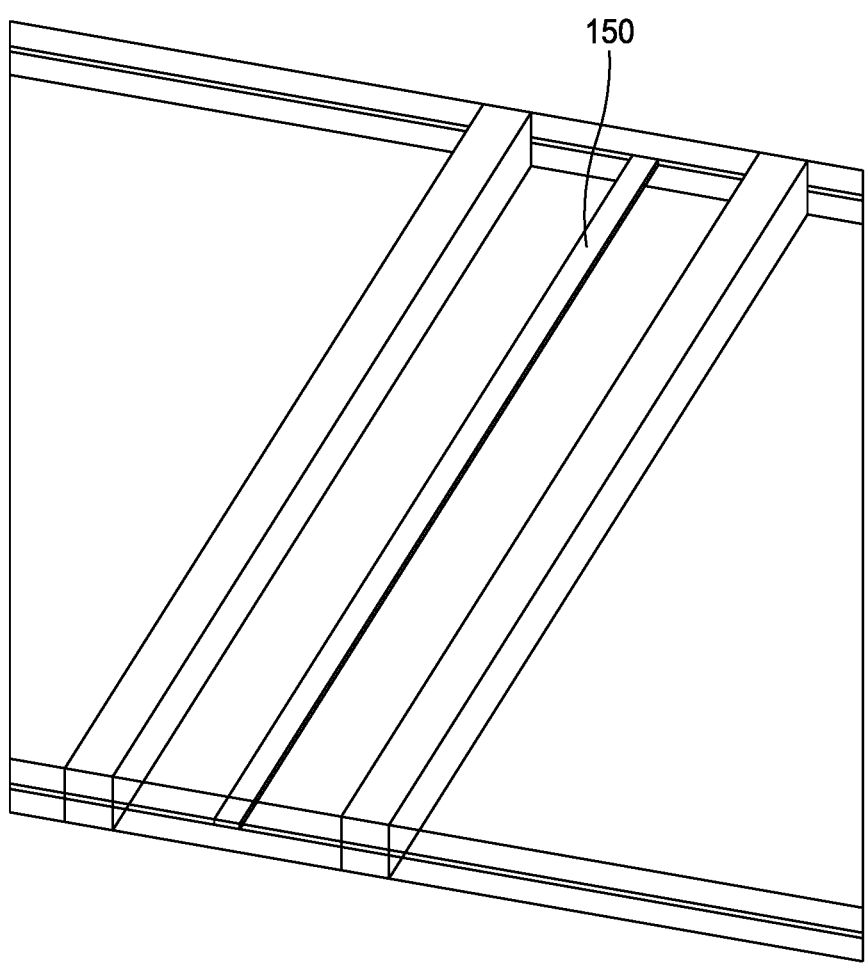
FIGS. 15-17 are views of a wave phased array architecture dilation trace of an embodiment of the present disclosure.
Figure 16:
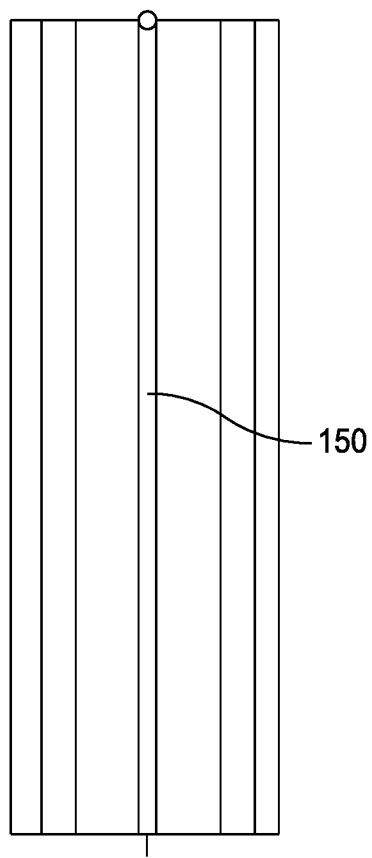
Figure 17:
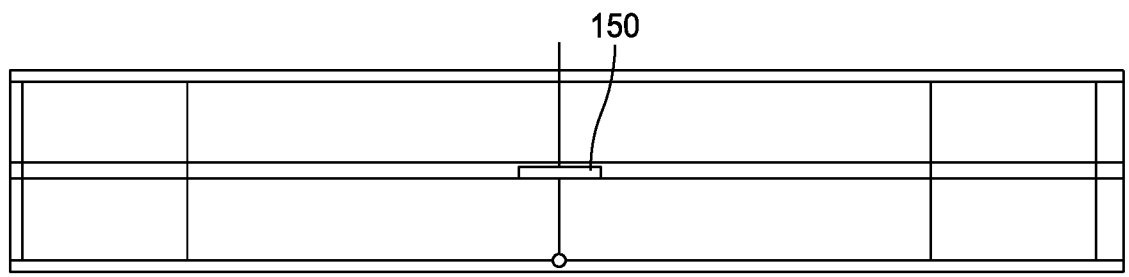

Referring to FIG. 15-17, the radiator dilation trace layer is indicated at 150.

Figure 18:
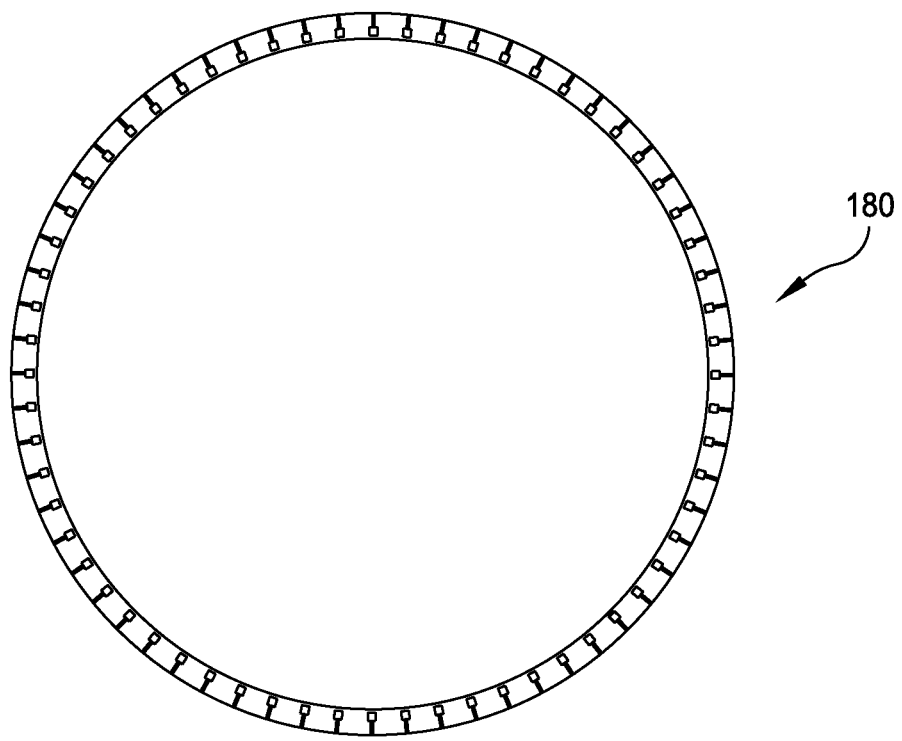
FIG. 18 is a plan view of a wave phased array architecture radiator dilation ground of an embodiment of the present disclosure.

Referring to FIG. 18, the radiator dilation ground is generally indicated at 180.

Figure 19:
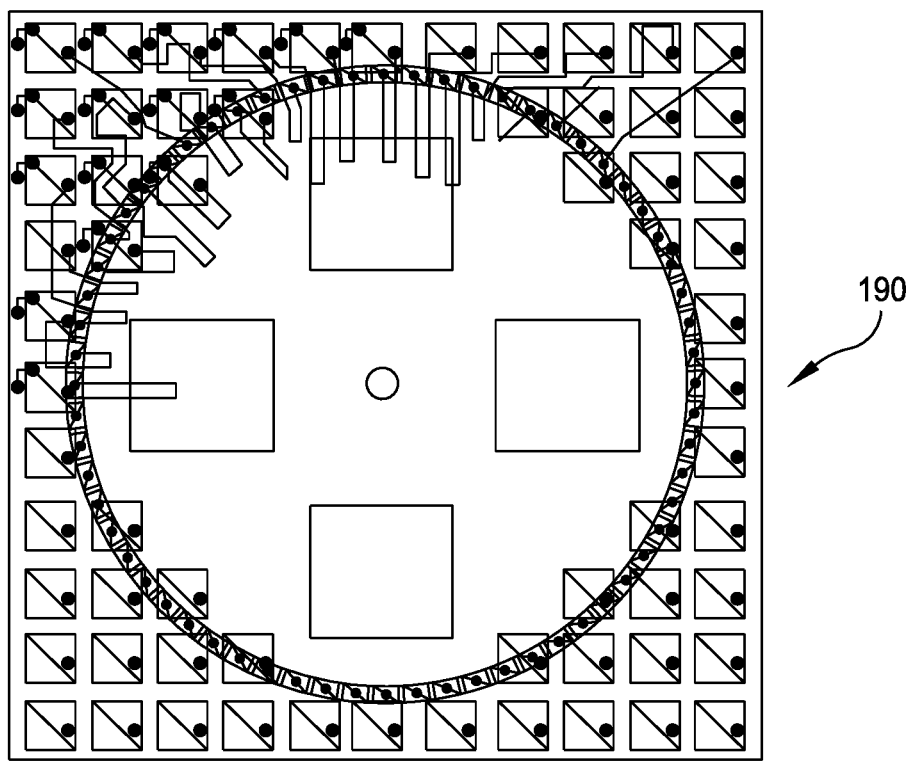
FIG. 19 is a plan view of a wave phased array architecture beamformer dilation of an embodiment of the present disclosure.

Referring to FIG. 19, the beamformer dilation layer is generally indicated at 190.

Figure 20:
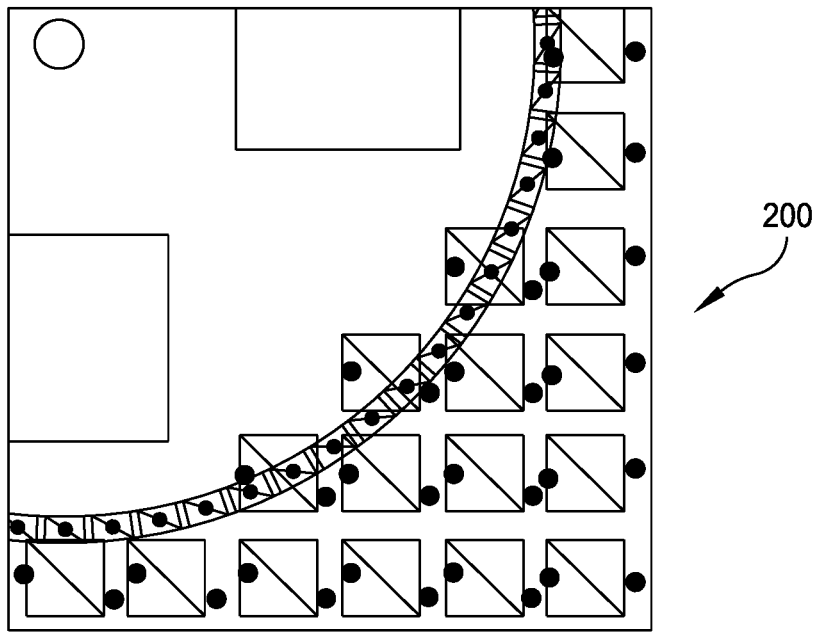
FIG. 20 is a plan view of a wave phased array architecture beamformer dilation ground of an embodiment of the present disclosure.

Referring to FIG. 20, the beamformer dilation ground is generally indicated at 200. The dilation circuit translates from the radiator to the active circuit geometry, using general transmission line theory.

Figure 21:
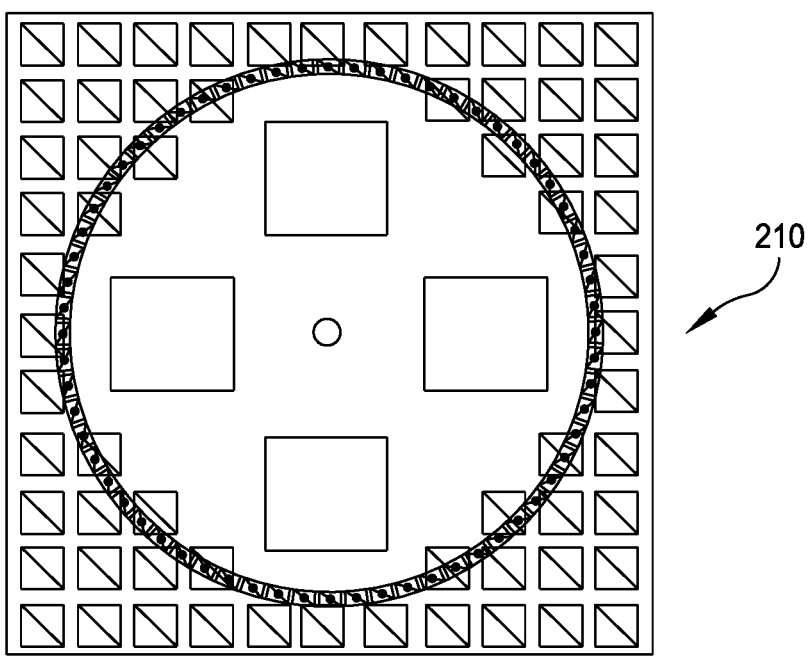
FIG. 21 is a plan view of a wave phased array architecture chip layout of an embodiment of the present disclosure.

Referring to FIG. 21, the chip layout is generally indicated at 210.

Figure 22:
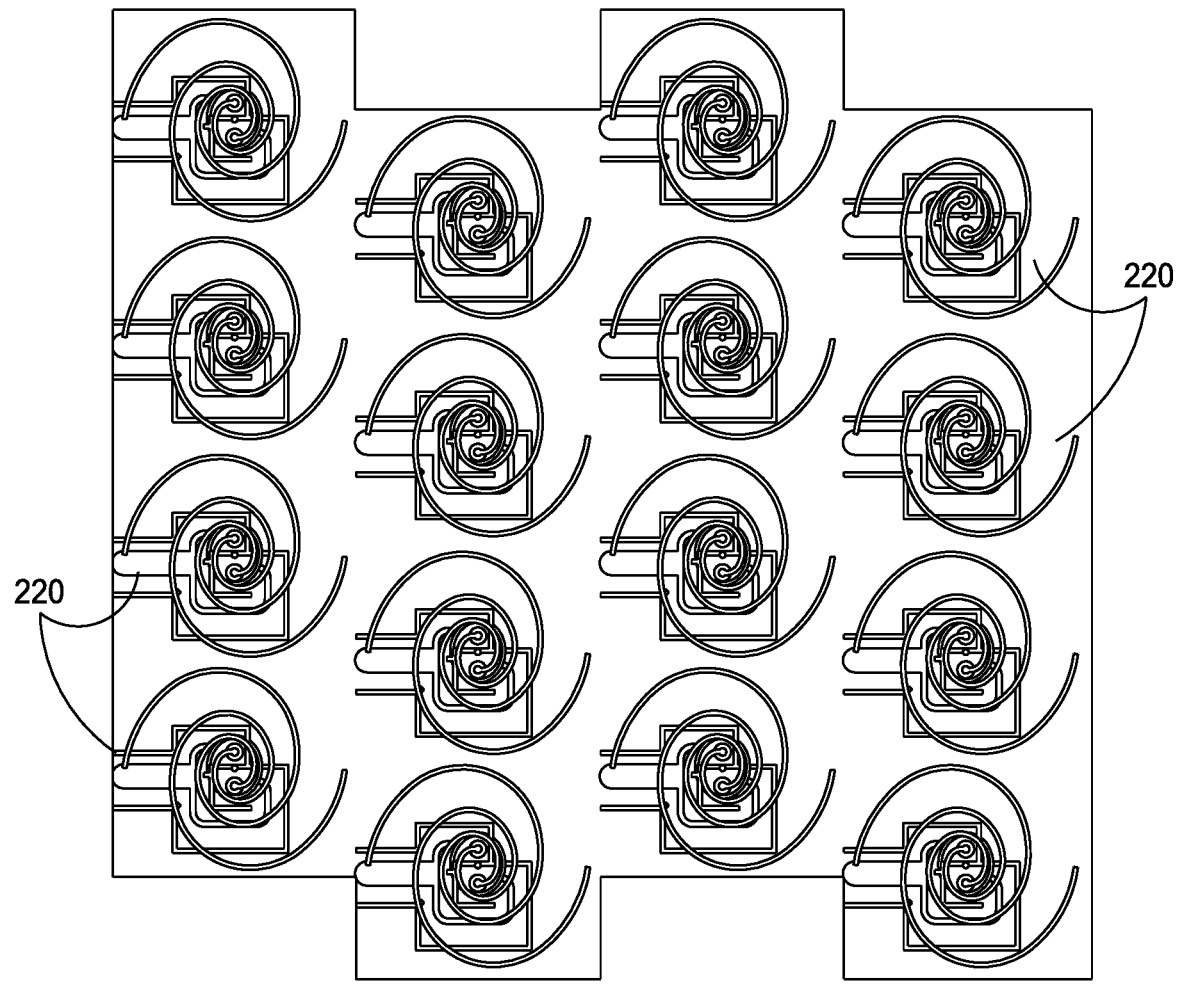
FIG. 22 is a plan view of a wave phased array spiral antenna of an embodiment of the present disclosure.

Referring to FIG. 22, the wave phased array antenna has a plurality of spiral radiators, each indicated at 220. In one embodiment, the spiral radiators 220 are spaced apart 5.18 mm from one another (center-to-center distance). The antenna is configured to operate in a 24-28 GHz operating ban, with 60-degree conical scan volume and single circular polarization. The array is composed of lattice of the radiating elements and active components. Lattice geometry follows general theory, and can be square, rectangular, triangular, or variants of these geometric shapes.

Electromagnetic circuits and methods in accord with aspects and embodiments described herein, which use additive manufacturing techniques, allow for electrically continuous Faraday boundaries, which may further be electrically coupled to ground planes. Accordingly, an electrically continuous structure is provided and disposed vertically through one or more substrates, (e.g., between opposing surfaces of the substrate) to form "Faraday walls" that confine electromagnetic fields. In various embodiments, such Faraday walls may electrically couple two or more ground planes. Further in various embodiments, such Faraday walls may confine and isolate electromagnetic fields from neighboring circuit components. In some embodiments, such Faraday walls may enforce a boundary condition to limit electromagnetic signals to be locally transverse electric-magnetic (TEM) fields, e.g., limiting signal propagation to a TEM mode.

In various embodiments, various subtractive (machining, milling, drilling), additive (printing, filling), and adherent (bonding) steps may be carried out, in various orders, with soldering and reflow operations as necessary, to form an electromagnetic circuit having one or any number of substrate layers, which may include one or more Faraday boundaries as described herein.

A generalized method for making any of various electromagnetic circuits includes milling a conductive material disposed on a substrate to form circuit features. The method may include printing (or depositing, e.g., via 3-D printing, additive manufacturing techniques) additional circuit features, such as resistors formed of resistive ink, for example. The method may include depositing solder on any feature, as necessary. The method may also include milling (or drilling) through substrate material (and/or conductive materials) to form openings, such as voids or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design. In some embodiments, multiple substrates may be involved in the manufacture of an electromagnetic circuit, and the method includes bonding further substrates as necessary, further milling and filling operations, and further soldering and/or reflow operations.

Further, electromagnetic circuits manufactured in accord with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

Moreover, wave phased arrays produced by the methods described herein can achieve 5G frequencies, and the use of additive and other novel techniques allow low loss performance at 5G frequencies. The 5G wave phased array does not rely on conventional PWB fabrication so the dimensions are not limited by PWB processes. As a result, wave phased arrays can be fabricated at a low cost.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A wave phased array manufactured using additive manufacturing technology (AMT), the wave phased array comprising:
   a radiator including a spiral antenna;
   a radiator dilation layer supporting the radiator;
   a beamformer supporting the radiator dilation layer;
   a beamformer dilation layer supporting the beamformer; and
   a substrate support layer supporting the beamformer dilation layer,
   wherein at least one of the radiator, the radiator dilation layer, the beamformer, the beamformer dilation layer and the substrate support layer is fabricated by an AMT process, and
   wherein the radiator further includes a vertical launch surrounding feed lines for the spiral antenna and Faraday walls disposed around the feed lines and the vertical launch.

2. The wave phased array of claim 1, wherein the wave phased array is configured to produce an electromagnetic signal having a frequency in the range of 24 GHz to 75 GHz.

3. The wave phased array of claim 1, wherein the wave phased array is configured to produce an electromagnetic signal having a frequency of approximately 30 GHz.

4. The wave phased array of claim 1, wherein the radiator has a thickness of approximately 97 mils.

5. The wave phased array of claim 4, wherein the radiator dilation layer has a thickness of approximately 23 mils.

6. The wave phased array of claim 5, wherein the beamformer has a thickness of approximately 52 mils.

7. The wave phased array of claim 6, wherein the substrate support layer embodies chips and DC logic and has a thickness of approximately 6 mils.

8. The wave phased array of claim 1, wherein the wave phase array has a total thickness of approximately 177 mils.

9. An AMT process for fabricating the wave phased array of claim 1 including a radiator, a radiator dilation layer supporting the radiator, a beamformer supporting the radiator dilation layer, a beamformer dilation layer supporting the beamformer, and a substrate support layer supporting the beamformer dilation layer.

10. The process of claim 9, wherein process steps include at least one of the following: milling; conductive ink deposition; and lamination under CAD control.

11. The process of claim 9, wherein the wave phased array is configured to produce an electromagnetic signal having a frequency in the range of 24 GHz to 75 GHz.

12. The process of claim 9, wherein the wave phased array is configured to produce an electromagnetic signal having a frequency of approximately 30 GHz.

13. The process of claim 9, wherein the radiator has a thickness of approximately 97 mils.

14. The process of claim 13, wherein the radiator dilation layer has a thickness of approximately 23 mils.

15. The process of claim 14, wherein the beamformer has a thickness of approximately 52 mils.

16. The process of claim 15, wherein the substrate support layer embodies chips and DC logic and has a thickness of approximately 6 mils.

17. The wave phased array of claim 1, wherein the at least one of the radiator, the radiator dilation layer, the beamformer, the beamformer dilation layer and the substrate is created by removing material by milling to create a void and depositing conductive ink to fill the void.

* * * * *